United States Patent
Nagai et al.

(10) Patent No.: US 7,982,275 B2
(45) Date of Patent: Jul. 19, 2011

(54) MAGNETIC ELEMENT HAVING LOW SATURATION MAGNETIZATION

(75) Inventors: Hide Nagai, Osaka-fu (JP); Zhitao Diao, Fremont, CA (US); Yiming Huai, Pleasanton, CA (US)

(73) Assignees: Grandis Inc., Milpitas, CA (US); Renesas Technology Corporation, Tokyo (JP)

( * ) Notice: Subject to any disclaimer, the term of this patent is extended or adjusted under 35 U.S.C. 154(b) by 789 days.

(21) Appl. No.: 11/843,496

(22) Filed: Aug. 22, 2007

(65) Prior Publication Data

US 2009/0050991 A1  Feb. 26, 2009

(51) Int. Cl.
*H01L 29/82* (2006.01)
*H01L 43/00* (2006.01)

(52) U.S. Cl. .......... 257/421; 257/422

(58) Field of Classification Search .......... 257/295, 257/421–422, E31.029
See application file for complete search history.

(56) References Cited

U.S. PATENT DOCUMENTS

| | | | |
|---|---|---|---|
| 5,695,864 A | 12/1997 | Slonczewski | |
| 6,137,662 A | 10/2000 | Huai et al. | |
| 6,146,775 A | 11/2000 | Fujita et al. | |
| 6,172,904 B1 | 1/2001 | Anthony et al. | |
| 6,175,476 B1 | 1/2001 | Huai et al. | |
| 6,201,763 B1 | 3/2001 | Bourgeois et al. | |
| 6,211,090 B1 | 4/2001 | Durlam et al. | |
| 6,222,707 B1 | 4/2001 | Huai et al. | |
| 6,266,218 B1 | 7/2001 | Carey et al. | |
| 6,351,355 B1 | 2/2002 | Min et al. | |
| 6,351,409 B1 | 2/2002 | Rizzo et al. | |
| 6,381,105 B1 | 4/2002 | Huai et al. | |
| 6,381,106 B1 | 4/2002 | Pinarbasi | |
| 6,430,085 B1 | 8/2002 | Rizzo | |
| 6,438,026 B2 | 8/2002 | Gillies et al. | |
| 6,447,935 B1 | 9/2002 | Zhang et al. | |
| 6,518,071 B1 | 2/2003 | Durlam et al. | |
| 6,545,906 B1 | 4/2003 | Savtchenko et al. | |
| 6,603,677 B2 | 8/2003 | Redon et al. | |
| 6,633,498 B1 | 10/2003 | Engel et al. | |
| 6,649,960 B1 | 11/2003 | Cross | |
| 6,687,098 B1 | 2/2004 | Huai | |
| 6,714,444 B2 | 3/2004 | Huai et al. | |
| 6,717,194 B2 | 4/2004 | Liu et al. | |
| 6,771,534 B2 | 8/2004 | Stipe | |

(Continued)

FOREIGN PATENT DOCUMENTS

JP    2006-093432    4/2006

(Continued)

OTHER PUBLICATIONS

Cowache et al., "Spin-valve structures with NiO pinning layers," IEEE Transactions on Magnetics, vol. 34, Iss. 4, part 1, (Jul. 1998) [abstract only].

(Continued)

*Primary Examiner* — Cuong Q Nguyen
(74) *Attorney, Agent, or Firm* — Fish & Richardson P.C.

(57) ABSTRACT

A magnetic device including a magnetic element is described. The magnetic element includes a fixed layer having a fixed layer magnetization, a spacer layer that is nonmagnetic, and a free layer having a free layer magnetization. The free layer is changeable due to spin transfer when a write current above a threshold is passed through the first free layer. The free layer is includes low saturation magnetization materials.

34 Claims, 16 Drawing Sheets

U.S. PATENT DOCUMENTS

| | | |
|---|---|---|
| 6,781,872 B2 | 8/2004 | Saito et al. |
| 6,791,868 B2 | 9/2004 | Gider et al. |
| 6,829,161 B2 | 12/2004 | Huai et al. |
| 6,838,740 B2 | 1/2005 | Huai et al. |
| 6,847,547 B2 | 1/2005 | Albert et al. |
| 6,888,704 B1 | 5/2005 | Diao et al. |
| 6,888,742 B1 | 5/2005 | Nguyen et al. |
| 6,893,741 B2 | 5/2005 | Doerner et al. |
| 6,920,063 B2 | 7/2005 | Huai et al. |
| 6,933,155 B2 | 8/2005 | Albert et al. |
| 6,950,335 B2 | 9/2005 | Dieny et al. |
| 6,958,927 B1 | 10/2005 | Nguyen et al. |
| 6,967,863 B2 | 11/2005 | Huai |
| 6,979,586 B2 | 12/2005 | Guo et al. |
| 6,985,385 B2 | 1/2006 | Nguyen et al. |
| 6,989,972 B1 | 1/2006 | Stoev et al. |
| 6,992,359 B2 | 1/2006 | Nguyen et al. |
| 7,006,375 B2 | 2/2006 | Covington |
| 7,009,877 B1 | 3/2006 | Huai et al. |
| 7,027,268 B1 | 4/2006 | Zhu et al. |
| 7,057,921 B2 | 6/2006 | Valet |
| 7,088,609 B2 | 8/2006 | Valet |
| 7,098,494 B2 | 8/2006 | Pakala et al. |
| 7,105,372 B2 | 9/2006 | Min et al. |
| 7,106,624 B2 | 9/2006 | Huai et al. |
| 7,110,287 B2 | 9/2006 | Huai et al. |
| 7,126,201 B2 | 10/2006 | Matsutera et al. |
| 7,224,601 B2 | 5/2007 | Panchula |
| 7,242,045 B2 | 7/2007 | Nguyen et al. |
| 2002/0015823 A1 | 2/2002 | Mauler et al. |
| 2002/0105827 A1 | 8/2002 | Redon et al. |
| 2003/0011945 A1* | 1/2003 | Yuasa et al. ............... 360/324.1 |
| 2003/0222322 A1 | 12/2003 | Park et al. |
| 2004/0130936 A1 | 7/2004 | Nguyen et al. |
| 2004/0136231 A1 | 7/2004 | Huai et al. |
| 2004/0170055 A1 | 9/2004 | Albert et al. |
| 2004/0235201 A1 | 11/2004 | Albert et al. |
| 2005/0041342 A1 | 2/2005 | Huai et al. |
| 2005/0063222 A1 | 3/2005 | Huai et al. |
| 2005/0106810 A1 | 5/2005 | Pakala et al. |
| 2005/0136600 A1 | 6/2005 | Huai |
| 2005/0184839 A1 | 8/2005 | Nguyen et al. |
| 2005/0237787 A1 | 10/2005 | Huai et al. |
| 2005/0254286 A1 | 11/2005 | Valet |
| 2005/0254287 A1 | 11/2005 | Valet |
| 2006/0018057 A1 | 1/2006 | Huai |
| 2006/0049472 A1 | 3/2006 | Diao et al. |
| 2006/0060901 A1* | 3/2006 | Nakamura et al. ............ 257/295 |
| 2006/0081953 A1 | 4/2006 | Nguyen et al. |
| 2006/0102969 A1 | 5/2006 | Huai et al. |
| 2006/0114618 A1 | 6/2006 | Hosomi et al. |
| 2006/0128038 A1 | 6/2006 | Pakala et al. |
| 2006/0141640 A1 | 6/2006 | Huai et al. |
| 2006/0192237 A1 | 8/2006 | Huai |
| 2006/0221676 A1 | 10/2006 | Qian et al. |
| 2006/0281258 A1 | 12/2006 | Dieny et al. |
| 2007/0047294 A1 | 3/2007 | Panchula |
| 2007/0063236 A1 | 3/2007 | Huai et al. |
| 2007/0063237 A1 | 3/2007 | Huai et al. |
| 2007/0171694 A1 | 7/2007 | Huai et al. |
| 2008/0061388 A1 | 3/2008 | Diao et al. |

FOREIGN PATENT DOCUMENTS

| | | |
|---|---|---|
| WO | WO 2007/035786 | 3/2007 |
| WO | WO 2007/075889 | 7/2007 |

OTHER PUBLICATIONS

Dokupil et al., Magnetostriction in combination with GMR/TMR-structures [online] Jun. 2, 2005, [etrieved pn Sep. 5, 2007] <URL: http://www.science24.com/paper/3919 >[abstract only].

Authorized Officer Jin Hoon Yoon, International Search Report/Written Opinion in PCT/US2008/073512 mailed Nov. 21, 2008, 11 pages.

Albert, et al., "Spin-polarized current switching of a Co thin film nanomagnet", *Applied Physics Letters*, vol. 77, No. 23, pp. 3809-3811, Dec. 4, 2000.

Berger, "Emission of spin waves by a magnetic multilayer traversed by a current", *Physical Review B*, vol. 54, No. 13, pp. 9353-9358, Oct. 1, 1996.

Cowburn et al., "Lateral interface anisotropy in nanomagnets," Journal of Applied Physics, 87(9): 7067-7069 (May 1, 2000).

Devolder, T. et al., "Instability threshold versus switching threshold in spin-transfer-induced magnetization switching", Physical Review B71, 184401-1-184401-6 (2005).

Doi, et al., "Magnetism of $Co_{1-x}Fe_x$-NOL in Specular Spin-Valves", *IEEE Transactions on Magnetics*, vol. 40, No. 4, pp. 2263-2265, Jul. 2004.

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

Slonczewski, et al., "Current-driven excitation of magnetic multilayers", *Journal of Magnetism and Magnetic Materials*, vol. 159, pp. L1-L7, 1996.

Thirion, C. et al., "Switching of magnetization by nonlinear resonance studied in single nanoparticles", Nature Materials, Nature Publishing Group, www.nature.com/naturematerials, vol. 2, 524-527 (Aug. 2003).

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Xi, Haiwen et al., "Spin-current effect on ferromagnetic resonance in patterned magnetic thin film structures", J of Applied Physics 97, 033904-1-033904-5 (2005).

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

* cited by examiner

MAGNETIC ELEMENT HAVING LOW SATURATION MAGNETIZATION

BACKGROUND

This application relates to magnetic materials and structures having at least one free ferromagnetic layer.

Various magnetic materials use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a spin valve (SV) which includes at least three layers: two ferromagnetic layers and a conducting layer between the two ferromagnetic layers. Another example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer.

Notably, the resistance to the electrical current across the MTJ or SV structures varies with the relative direction of the magnetizations in the two ferromagnetic layers. When the magnetizations of the two ferromagnetic layers are parallel to each other, the resistance across the MTJ or SV structures is at a minimum value RP. When the magnetizations of the two ferromagnetic layers are anti-parallel with each other, the resistance across the MTJ or SV is at a maximum value RAP. The magnitude of this effect is commonly characterized by the tunneling magnetoresistance (TMR) in MTJs or magnetoresistance (MR) in SVs defined as (RAP-RP)/RP.

SUMMARY

This application discloses devices including magnetic elements that include at least a fixed layer, a nonmagnetic spacer layer, and a free low saturation magnetization layer. The spacer layer resides between the fixed and free layers. The magnetic element is configured to allow the free layer to be switched using spin transfer when a write current is passed through the magnetic element.

In some implementations, the magnetic element further includes a second spacer layer and a second fixed layer. In other aspects, the magnetic element further includes a second spacer layer, a second fixed layer and a second free layer magnetostatically coupled to the free layer.

One or more of the free layers are configured to have low saturation magnetization. In certain implementations, one or more of the free layers could include ferromagnetic material(s) combined with nonmagnetic material(s) In certain implementations the nonmagnetic material(s) include at least one of Zr, Ta, Nb, Mo, Re, W, Ti, V, Cr and Hf. In certain implementations the nonmagnetic materials include at least two nonmagnetic materials X and Y; where X includes at least one of Ti, Zr, and Hf; and Y includes at least one of V, Nb, Ta, Cr, Mo, W, and Re.

In certain implementations, one or more of the spacer layer(s) could include insulating layers or conducting layers. In certain implementations, one or more of the free layer(s) or fixed layer(s) could be synthetic. In certain implementations, the magnetic element could include a high spin polarization layer residing next to one or more free layer. In certain implementations, the composition of the ferromagnetic material(s) combined with nonmagnetic material(s) is controlled to provide low magnetostriction.

Some of the disclosed implementations may have the advantages of an amorphous structure that can contribute to lowering switching current, low saturation magnetization that can contribute to lowering switching current, low magnetostriction that can contribute to reducing switching current variability, or induced perpendicular anisotropy that can contribute to reducing switching current.

DETAILED DESCRIPTION

Figure 1A:
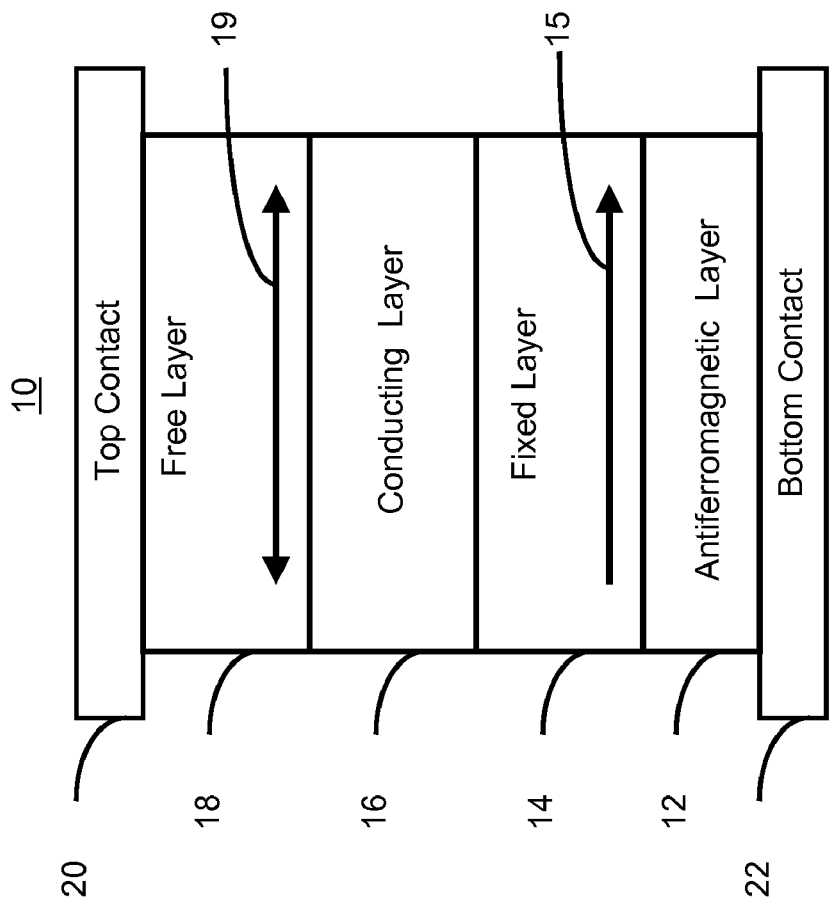
FIG. 1A is a diagram of a magnetic element in the form a spin valve.
Figure 1B:
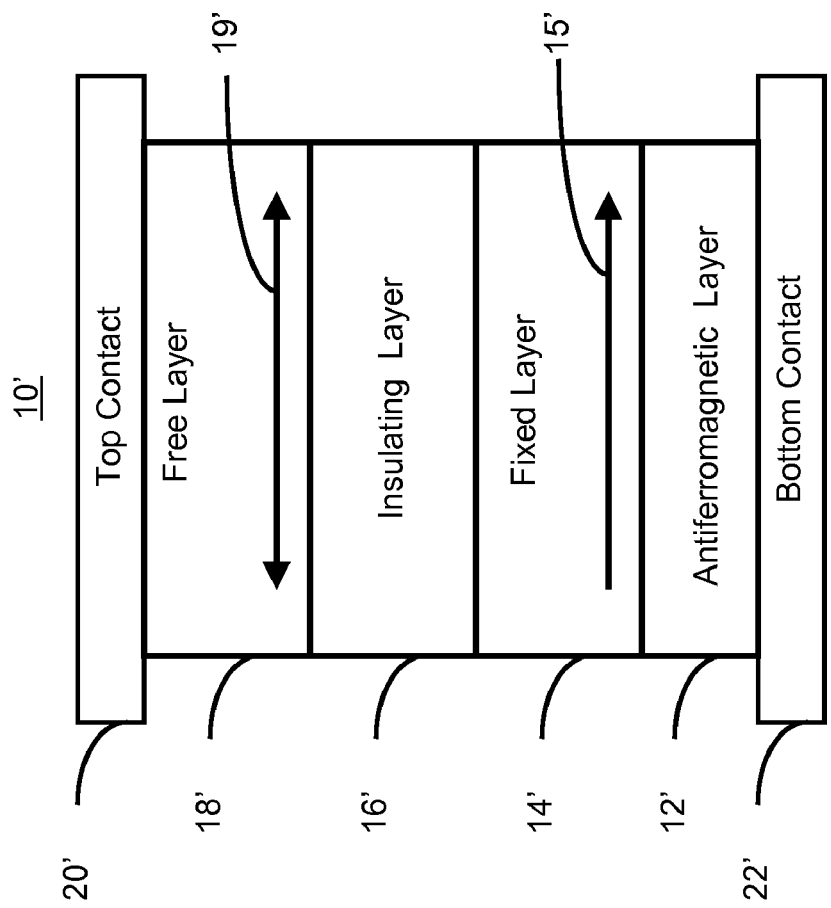
FIG. 1B is a diagram of magnetic element in the form of a spin tunneling junction.

FIGS. 1A and 1B depict magnetic elements 10 and 10'. The magnetic element 10 is a spin valve and includes a antiferromagnetic (AFM) layer 12, a fixed layer 14, a conductive spacer layer 16 and a free layer 18. Other layers (not shown), such as seed or capping layer can also be used. The fixed layer 14 and the free layer 18 are ferromagnetic. The free layer 18 is depicted as having a changeable magnetization 19. The magnetization of the free layer 18 is free to rotate, typically in response to an external magnetic field. The conductive spacer layer 16 is nonmagnetic. The AFM layer 12 is used to pin the magnetization of the fixed layer 14 in a particular direction.

After post annealing, the ferromagnetic layer 14 is pinned with a fixed magnetization 15. Also depicted are top contact 20 and bottom contact 22 that can be used to drive current through the magnetic element 10.

The magnetic element 10' depicted in FIG. 1B is a magnetic tunneling junction. Portions of the magnetic tunneling junction 10' are analogous to the spin valve 10. Thus, the magnetic element 10' includes an AFM layer 12', a fixed layer 14' having a fixed layer magnetization 15', a insulating barrier layer 16', a free layer 18' having a changeable magnetization 19'. The barrier layer 16' is thin enough for electrons to tunnel through in a magnetic tunneling junction 10'.

The relationship between the resistance to the current flowing across the MTJ or SV and the relative magnetic direction between the two ferromagnetic layers in the TMR or MR effect can be used for nonvolatile magnetic memory devices to store information in the magnetic state of the magnetic element. Magnetic random access memory (MRAM) devices based on the TMR or MR effect, for example, can be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction and thus operate as a recording layer. Information is stored based on the relative magnetic direction of the two ferromagnetic layers on two sides of the barrier of the MTJ or SV. For example, binary bits "1" and "0" can be recorded as the parallel and anti-parallel orientations of the two ferromagnetic layers in the MTJ or SV. Recording or writing a bit in the MTJ or SV can be achieved by switching the magnetization direction of the free layer, e.g., by a writing magnetic field generated by supplying currents to write lines disposed in a cross stripe shape, by a current flowing across the MTJ or SV based on the spin transfer effect, or by other means.

In spin-transfer switching, the current required for changing the magnetization of the free layer can be significantly less than the current used for the field switching. Therefore, the spin-transfer switching in a MTJ or SV can be used to significantly reduce the power consumption of the cell. However, the write current that causes spin-transfer switching can lead to design problems for high density MRAM, such as heating, high power consumption, large transistor size, as well as other issues. Moreover, if an MTJ is used a high write current can lead to a degradation of the insulating barrier. Accordingly, what is needed is a magnetic element having magnetic layers that can be switched using spin transfer at a lower current density that consumes less power.

This application describes magnetic devices including a magnetic element having at least one low saturation magnetization free ferromagnetic layer that can be switched with the spin transfer effect.

Figure 2A:
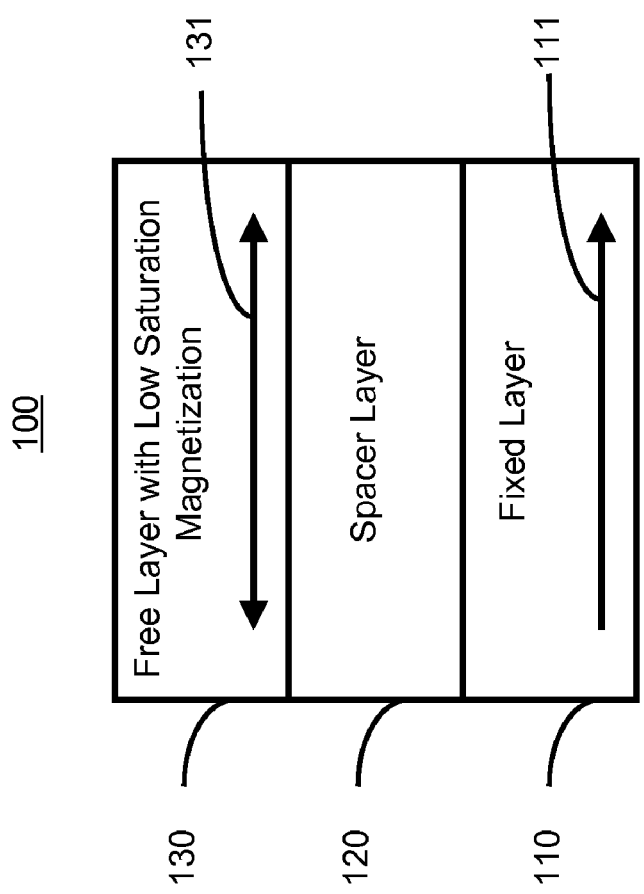
FIG. 2A depicts a first implementation, a portion of a magnetic element having a low saturation magnetization free layer.

FIG. 2A depicts one implementation, a magnetic element 100 having a low saturation magnetization free layer. The magnetic element 100 includes a fixed layer 110, a spacer layer 120, and a free layer 130. As described below, the free layer 130 is configured to have a low saturation magnetization. Furthermore, the magnetic element 100 is configured such that the free layer 130 can be written using spin transfer.

Figure 2B:
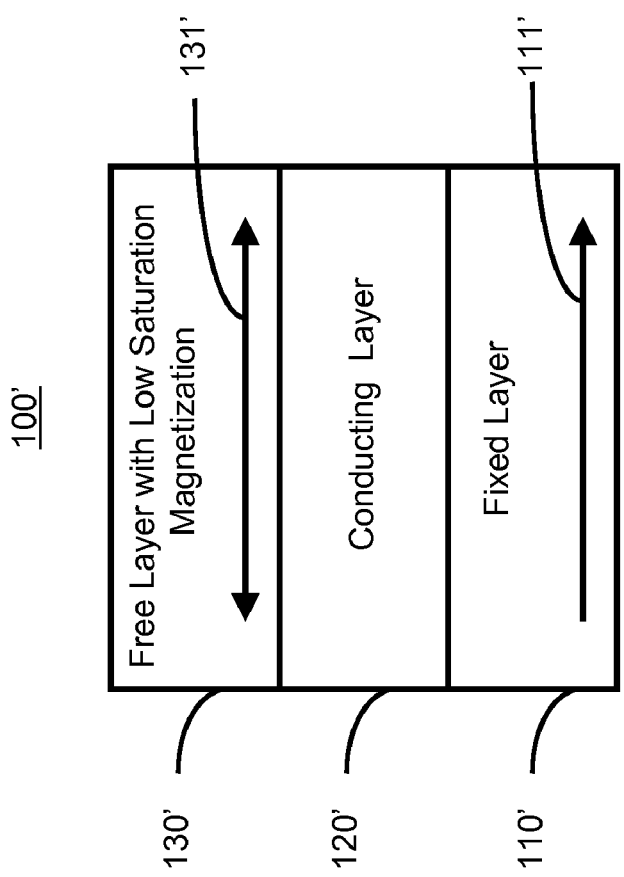
FIG. 2B depicts another implementation, a portion of a magnetic element utilizing a conducting spacer layer having a low saturation magnetization free layer.

FIG. 2B depicts a magnetic element 100' that is analogous to the magnetic element 100. Thus, analogous components are labeled similarly. The magnetic element 100', therefore, includes a free layer 130' that can be written using spin transfer and that has a low saturation magnetization. The magnetic element 100' also includes a fixed layer 110'. However, the magnetic element 100' includes a conducting spacer layer 120'.

Figure 2C:
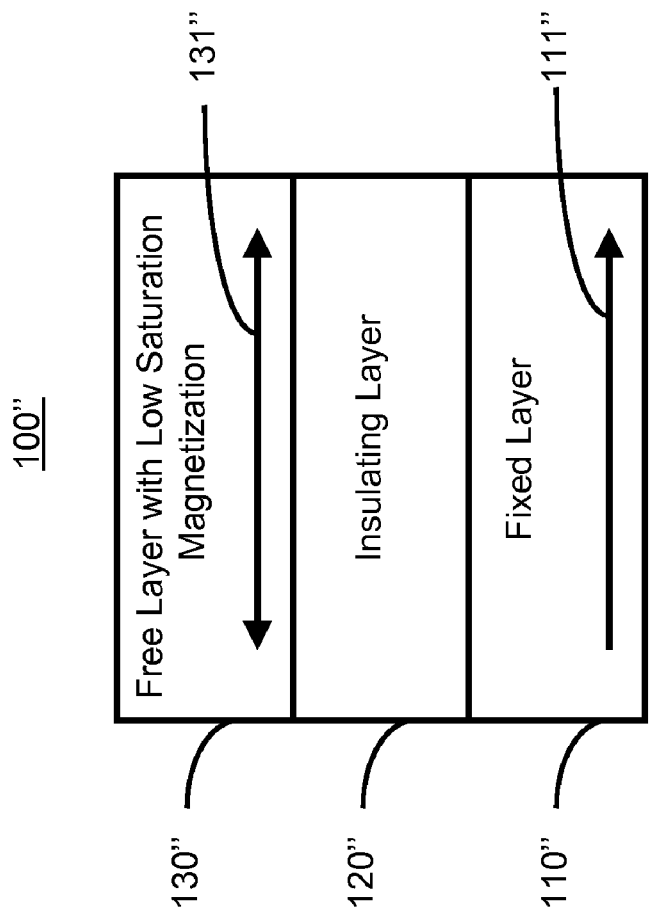
FIG. 2C depicts another implementation, a portion of a magnetic element utilizing an insulating spacer layer having a low saturation magnetization free layer.

FIG. 2C depicts a magnetic element 100" that is analogous to the magnetic element 100. Like the magnetic element 100, the magnetic element 100" includes a fixed layer 110" having a fixed layer magnetization 111" and a free layer 130" with a low saturation magnetization 131" that can be written using spin transfer. However, the magnetic element 100" includes a insulating spacer layer 120".

Figure 2D:
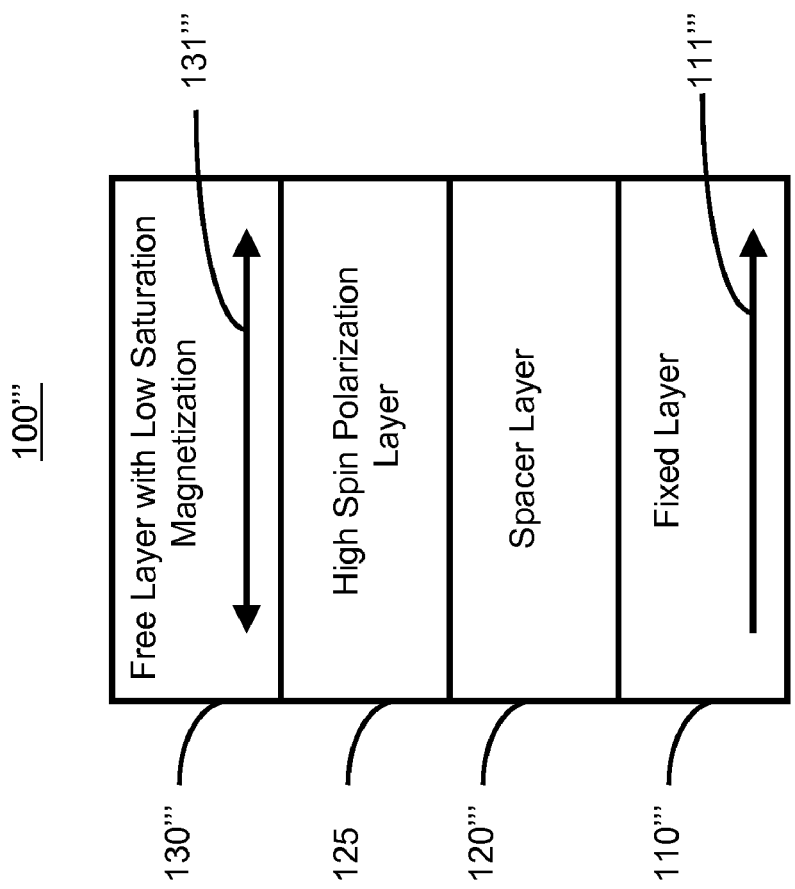
FIG. 2D depicts another implementation, a portion of a magnetic element utilizing a high spin polarization layer having a low saturation magnetization free layer.

FIG. 2D depicts a magnetic element 100''' that is analogous to the magnetic element 100. Like the magnetic element 100, the magnetic element 100''' includes a fixed layer 110''' having a fixed layer magnetization 111''', a spacer layer 120''', and a free layer 130''' with a low saturation magnetization 131''' that can be written using spin transfer. The magnetic element 100''' further includes a high spin polarization layer 140 residing between the spacer layer 120''' and free layer 130'''. A high spin polarization material has higher spin polarization than the adjacent ferromagnetic layer. The high spin polarization layer 140, such as CoFe three to eight angstroms thick, resides at the interface between the free layer 130''' and the spacer layer 120''' and increases magnetoresistance and spin torque.

Figure 2E:
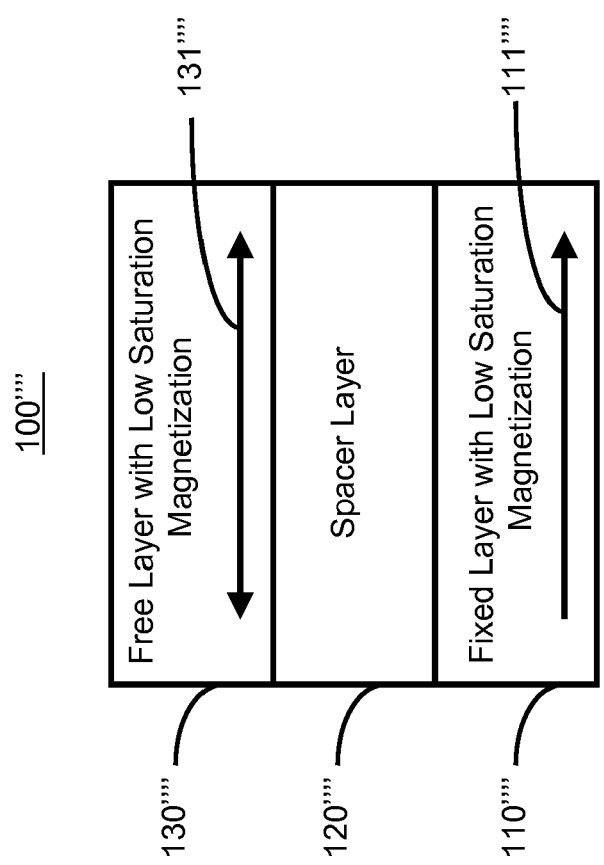
FIG. 2E depicts implementation, a portion of a magnetic element utilizing a low saturation magnetization fixed layer having a low saturation magnetization free layer.

FIG. 2E depicts a magnetic element 100'''' that is analogous to the magnetic element 100. Like the magnetic element 100, the magnetic element 100'''' includes a fixed layer 110'''' having a fixed layer magnetization 111'''', a spacer layer 120'''', and a free layer 130'''' having a free layer magnetization 131'''' that can be written using spin transfer. Both the fixed layer 110'''' and the free layer 130'''' include low saturation magnetization materials.

Figure 2F:
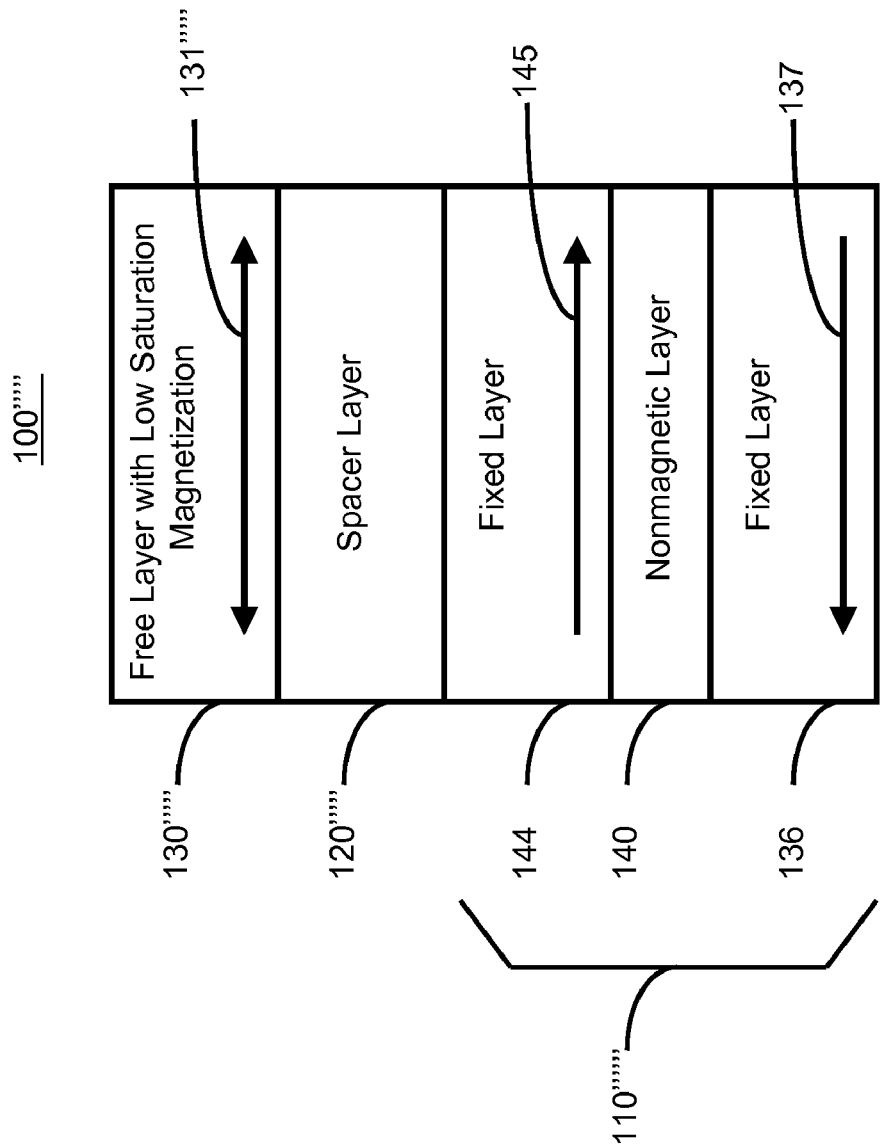
FIG. 2F depicts another implementation, a portion of a magnetic element utilizing a synthetic fixed layer having a low saturation magnetization free layer.

FIG. 2F depicts a magnetic element 100''''' that is analogous to the magnetic element 100. Like the magnetic element 100, the magnetic element 100''''' includes a spacer layer 120''''' and a free layer 130''''' with a low saturation magnetization 131''''' that can be written using spin transfer. The magnetic element 100''''' also includes a synthetic fixed layer 110''''' that includes a fixed layer 144 with a fixed layer magnetization 145, a nonmagnetic layer 140, and a fixed layer 136 with a fixed layer magnetization 137. An antiferromagnetic layer (not shown) can be included to pin the magnetization of the fixed layer 136 in a desired direction after post annealing. The nonmagnetic layer 140 preferably includes Ru and is configured such that the fixed layer magnetizations 137 and 145 are antiparallel.

Figure 2G:
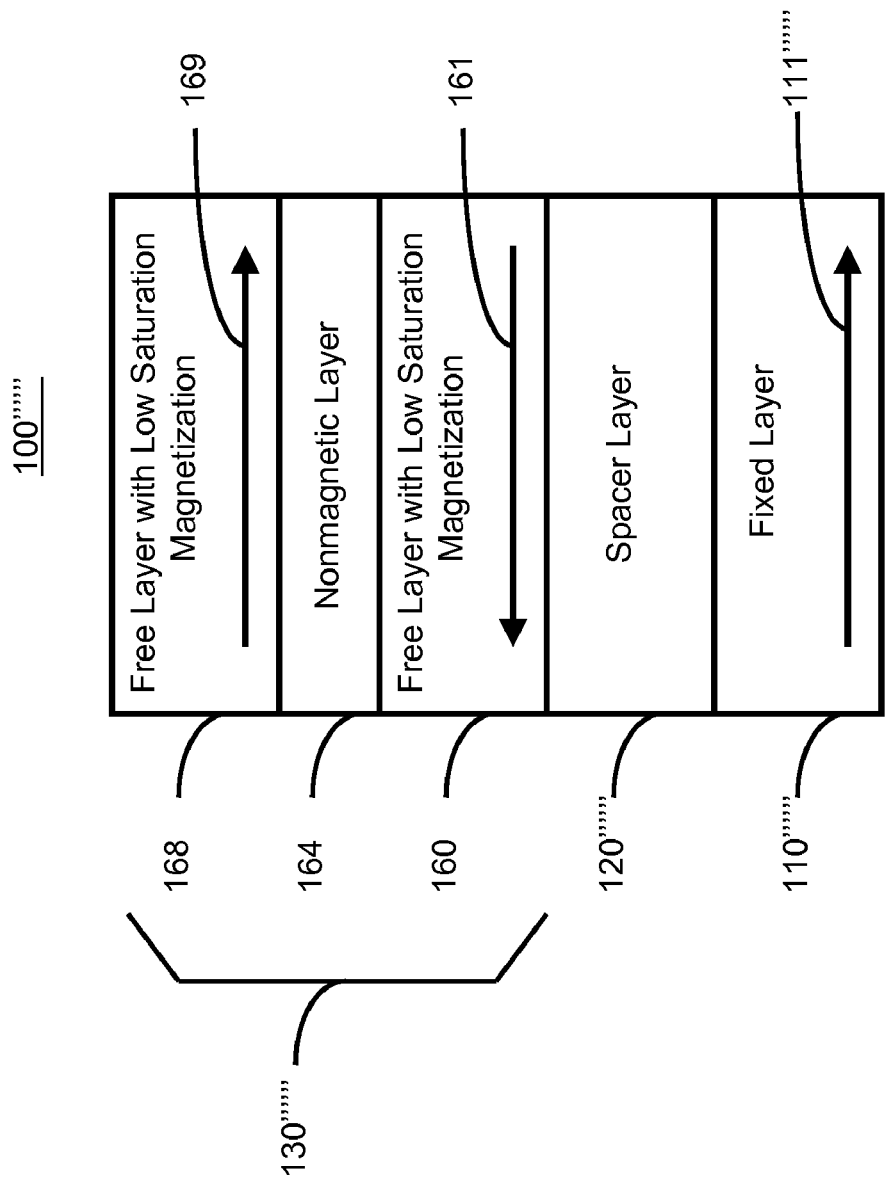
FIG. 2G depicts another implementation, a portion of a magnetic element utilizing a synthetic free layer having a low saturation magnetization free layer.

FIG. 2G depicts a magnetic element 100'''''' that is analogous to the magnetic element 100. Like the magnetic element 100, the magnetic element 100'''''' includes a fixed layer 110'''''' with a saturation magnetization 111'''''' and a spacer layer 120''''''. The magnetic 100'''''' element also includes a synthetic free layer 130'''''' with low saturation magnetization that can be written using spin transfer. The free layer 130'''''' includes a free layer 160 with a magnetization 161, a nonmagnetic layer 164, and a free layer 168 with magnetization 169. The nonmagnetic layer 164 can include Ru and is configured such that the magnetization of layers 160 and 168 are antiparallel.

The magnetic elements 100, 100', 100", 100''', 100'''', 100''''', and 100'''''' can be used in various devises such as magnetic memory. The magnetic elements 100, 100', 100", 100''', 100'''', 100''''', and 100'''''' can be used in a memory cell including an isolation transistor (not shown), as well as other configurations of magnetic memories. Moreover, the magnetic elements 100, 100', 100", 100''', 100'''', 100''''', and 100'''''' can utilize two terminals (not shown) near the top and bottom of the magnetic element. The magnetic elements 100, 100', 100", 100''', 100'''', 100''''', and 100'''''' can use another number of terminals, for example a third terminal near the center of the magnetic element. The magnetic elements 100, 100', 100", 100''', 100'''', 100''''', and 100'''''' can also include an AFM layer (not shown) used to pin the magnetization of the fixed layers 110, 110', 110", 110''', 110'''', 136, and 110'''''', as well as seed layers (not shown) and capping layers (not shown). Furthermore, the magnetic elements 100, 100', 100", 100''', 100'''', 100''''', and 100'''''' are configured such that the free layers 130, 130', 130", 130''', 130'''', 130''''', and 130'''''' can be written using spin transfer.

For magnetic elements 100, 100', 100", 100''', 100'''', 100''''', and 100'''''', some difference can be provided between the lateral dimensions of elements to ensure that the free layer 130, 130', 130", 130''', 130'''', 130''''', and 130'''''' has a particular easy axis in the plane of the free layer.

Referring to FIG. 2A, for clarity, the discussion below primarily refers to the free layer 130. However, free layers 130', 130", 130''', 130'''', 130''''', and 130'''''' can be provided in a similar manner as that described for the free layer 130. Moreover, other magnetic layers within elements 100, 100', 100", 100''', 100'''', 100''''', and 100'''''' can also be provided in a similar manner as that described for free layer 130.

Referring back to FIG. 2A, the low saturation magnetization can be provided by providing a free layer that includes a ferromagnetic material and nonmagnetic material. To obtain low saturation magnetization for the free layer 130, a ferromagnetic material and a nonmagnetic material can be combined in a single ferromagnetic layer used in or for the free layer 130. Thus, the low saturation magnetization free layer 130 can be made by combining ferromagnetic and nonmagnetic materials.

For example, a low saturation magnetization free layer 130 can be provided by combining ferromagnetic material Co, Fe, Ni, or one of their alloys with at least Zr, W, Ti, V, or Hf. In one implementation, the elements Zr, W, Ti, V, or Hf are in the range of five through fifty atomic percent. In another implementation, a low saturation free layer 130 can be provided by combining ferromagnetic material Co, Fe, Ni, or one of their alloys with at least two nonmagnetic materials X and Y where X includes Ti, Zr, or Hf and Y includes V, NB, Ta, Cr, Mo, W, or Re. In one implementation, the sum of the materials X and Y are in the range of five through fifty atomic percent. In another implementation, a low saturation magnetization free layer 130 can be provided by combining ferromagnetic material Co, Fe, Ni, or one of their alloys with at least Zr and Ta. In one implementation, the sum of Zr and Ta are in the range of five through fifty atomic percent.

Because the current required to switch a magnetic element by the spin transfer effect increases with increasing magnetization of the free layer, combining the ferromagnetic material(s) with nonmagnetic materials(s) can provide the benefit of lowering the spin transfer switching current.

Some implementations can have the benefit of promoting an amorphous structure during magnetic layer deposition that can have the additional benefit of lowering the spin transfer switching current. An amorphous structure can also have the benefit of increasing TMR and MR.

An annealing process can crystallize some amorphous magnetic based alloys. In the implementation utilizing a low saturation magnetization free layer 130 that is provided by doping ferromagnetic material Co, Fe, Ni, or one of their alloys with at least Zr and Ta ranging between 5 and 50 atomic percent an annealing process can cause the free layer 130 to crystallize. In one implementation, the atomic percentage of Zr is greater than the atomic percentage of Ta, the free layer is in the hcp or fcc crystal structure after annealing, and the free layer 130 has a perpendicular anisotropy so that it magnetization 131 is perpendicular to the plane of the free layer. Utilizing materials that provide a perpendicular anisotropy can provide a benefit of a lower switching current compared to an in plane anisotropy. In another implementation, the atomic percentage of Zr is less than the atomic percentage of Ta and the free layer is in the bcc crystal structure after annealing.

Controlling the composition of the free layer can control the magnetostriction of the magnetic element. For example, in the case of Co doped with Ti, Zr, or Hf the magnetostriction is positive. In the case of Co doped with V, Nb, Ta, Cr, Mo, W, or Re the magnetostriction is negative. By controlling the ration of X and Y a magnetic element can be provided with low magnetostriction. Lowering the magnetostriction can have the benefit of lowering the variability of the switching current in some implementations. In one implementation a low saturation magnetization free layer 130 is provided by combining ferromagnetic material Co, Fe, Ni, or one of their alloys with at least two nonmagnetic materials X and Y where X includes Ti, Zr, or Hf and Y includes V, NB, Ta, Cr, Mo, W, or Re such that the ratio of X and Y is controlled to achieve low magnetostriction.

Thus, the magnetic elements 100, 100', 100", 100''', 100'''', 100''''', and 100'''''' include the free layers 130, 130', 130", 130''', 130'''', 130''''', and 130'''''', respectively, having a low saturation magnetization as defined above. Consequently, some of the implementations of the magnetic elements 100, 100', 100", 100''', 100'''', 100''''', and 100'''''' can be written using spin transfer at a lower switching current. By controlling the composition of the magnetic elements some implementations can achieve additional benefits such as perpendicular anisotropy, amorphous structure, or low magnetostriction.

Figure 3A:
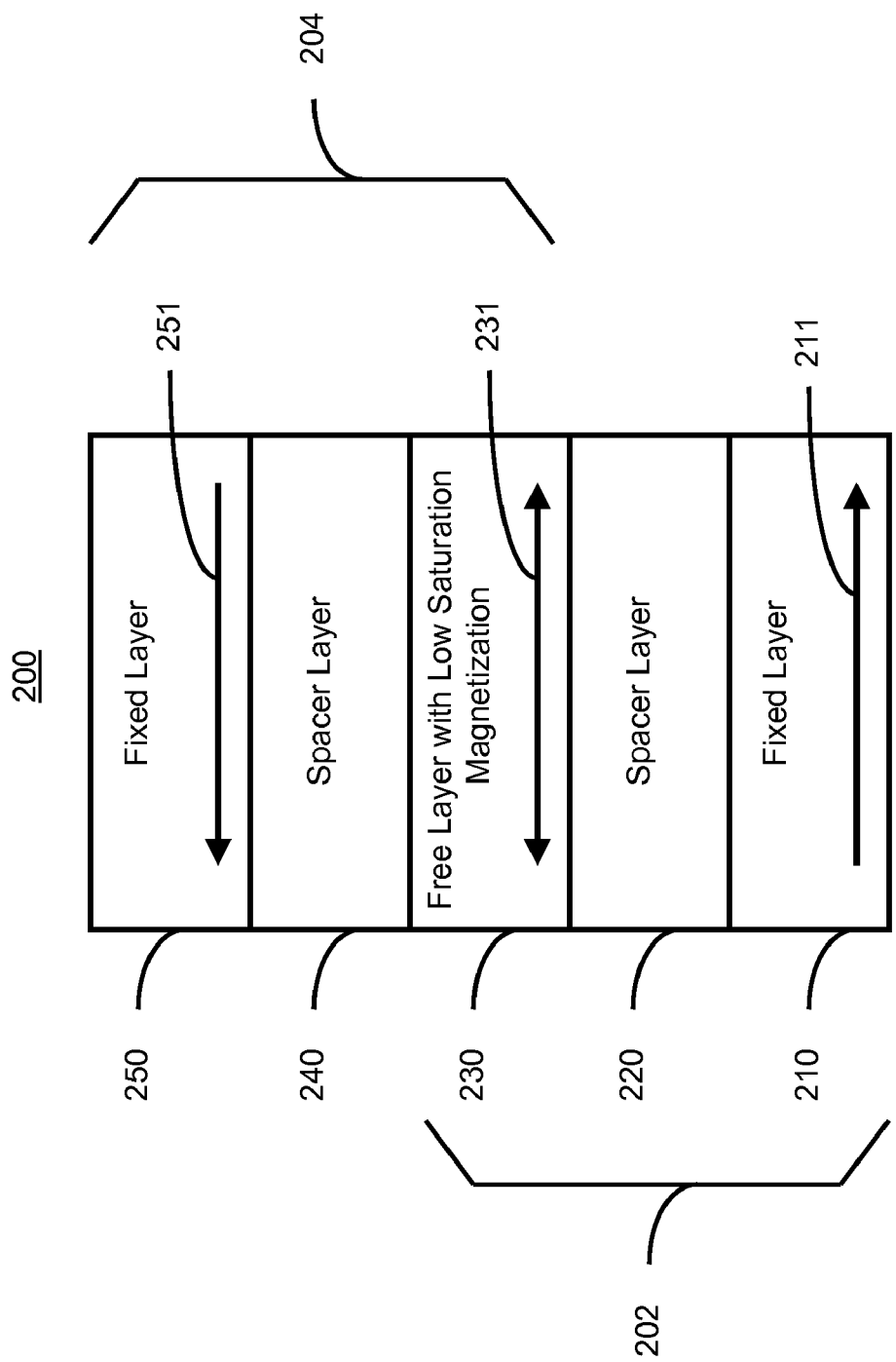
FIG. 3A depicts another implementation, a magnetic element having a low saturation magnetization free layer.

FIG. 3A depicts another implementation of a magnetic element 200 having a low saturation magnetization free layer. The magnetic element includes a fixed layer 210 with a fixed layer magnetization 211, a spacer layer 220, a free layer 230 with a free layer magnetization 231, a spacer layer 240, and a fixed layer 250 with a fixed layer magnetization 251.

Figure 4:
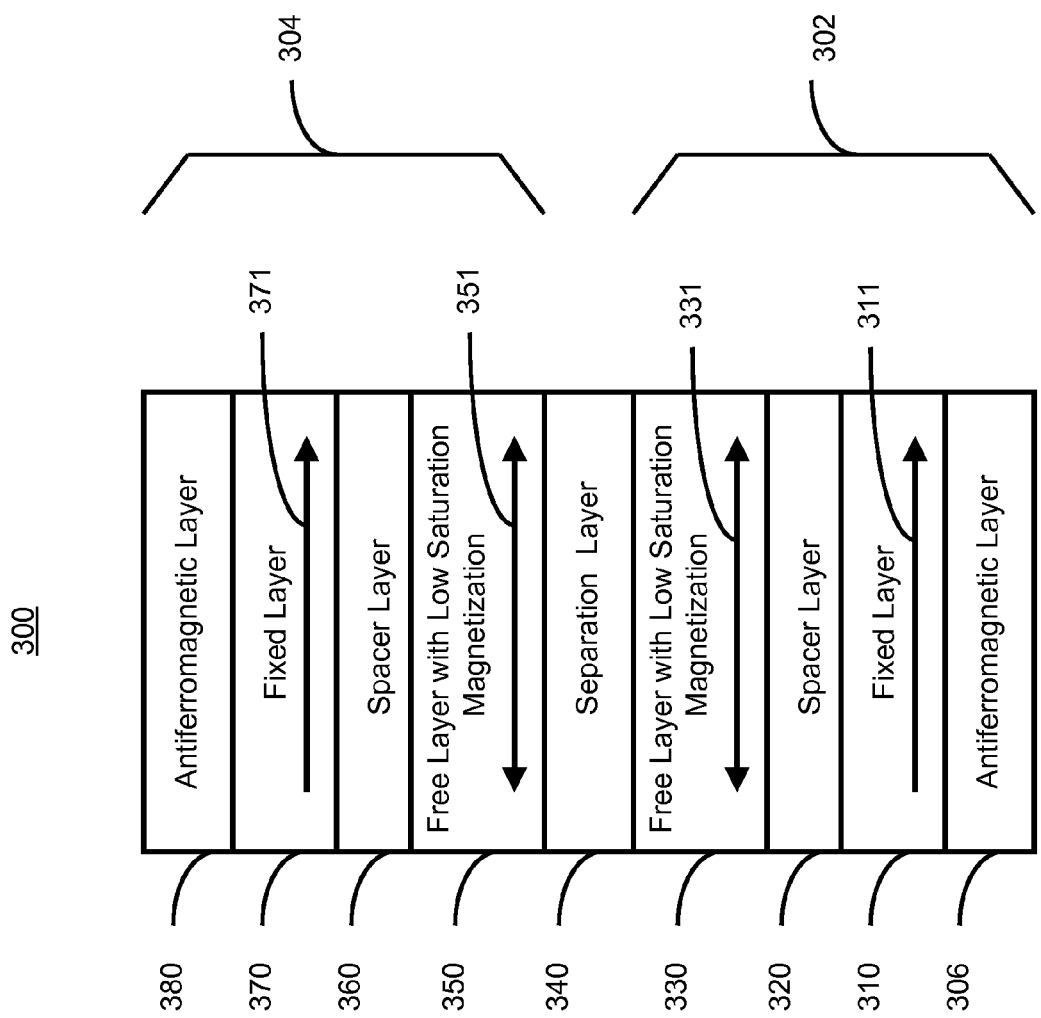
FIG. 4 depicts another implementation, a magnetic element having a low saturation magnetization free layer.

In one implementation the spacer layer 220 is insulating and the spacer layer 240 is conducting. In such an implementation the magnetic element 200 includes a spin valve portion 204 and a magnetic tunneling junction portion 202 that share the free layer 230. Referring to FIGS. 2A and 4, the layers 250, 240, and 230 are analogous to the layers 110, 120, and 130 in the magnetic element 100 when the spacer layer 120 is conducting. Similarly, the layers 210, 220, and 230 are analogous to the layers 110, 120, and 130, respectively, when the spacer layer 120 is an insulating barrier layer. The fixed layers 210 and 250 thus correspond to the fixed layer 110 and can be configured using analogous materials, layers, and/or process. The free layer 230 is configured to be written using spin transfer and has a low saturation magnetization. The magnetic element 200 can include pinning layers (not shown) and can include antiferromagnetic layers, that pin the fixed layers 210 and 250. Moreover, the magnetic element 200 can utilize two terminals (not shown) near the top and bottom of the magnetic element. Further, the magnetic element 200 can include another number of terminals, for example a third terminal near the center of the magnetic element 200.

The free layer 230 can be configured in a manner analogous to the free layers 130, 130', 130", 130''', 130'''', 130''''', and/or 130''''''. Thus, analogous materials and principles to those discussed above can be used to achieve the low saturation magnetization of the free layer 230. For example, the combination of ferromagnetic materials with nonmagnetic materials can be used to achieve a low saturation magnetization for the free layer 230. The magnetic element 200 can share the benefits of the magnetic elements 100, 100', 100", 100''', 100'''', 100''''', and 100'''''', and their combinations. Furthermore, when the fixed layers 210 and 250 are aligned antiparallel, both the spin valve portion 204 and the magnetic tunneling junction portion 202 can contribute to writing the free layer 230. Because of the use of the barrier layer 220, the magnetic element 200 can have a higher resistance and magnetoresistance. Consequently, a higher signal can be obtained during reading.

Figure 3B:
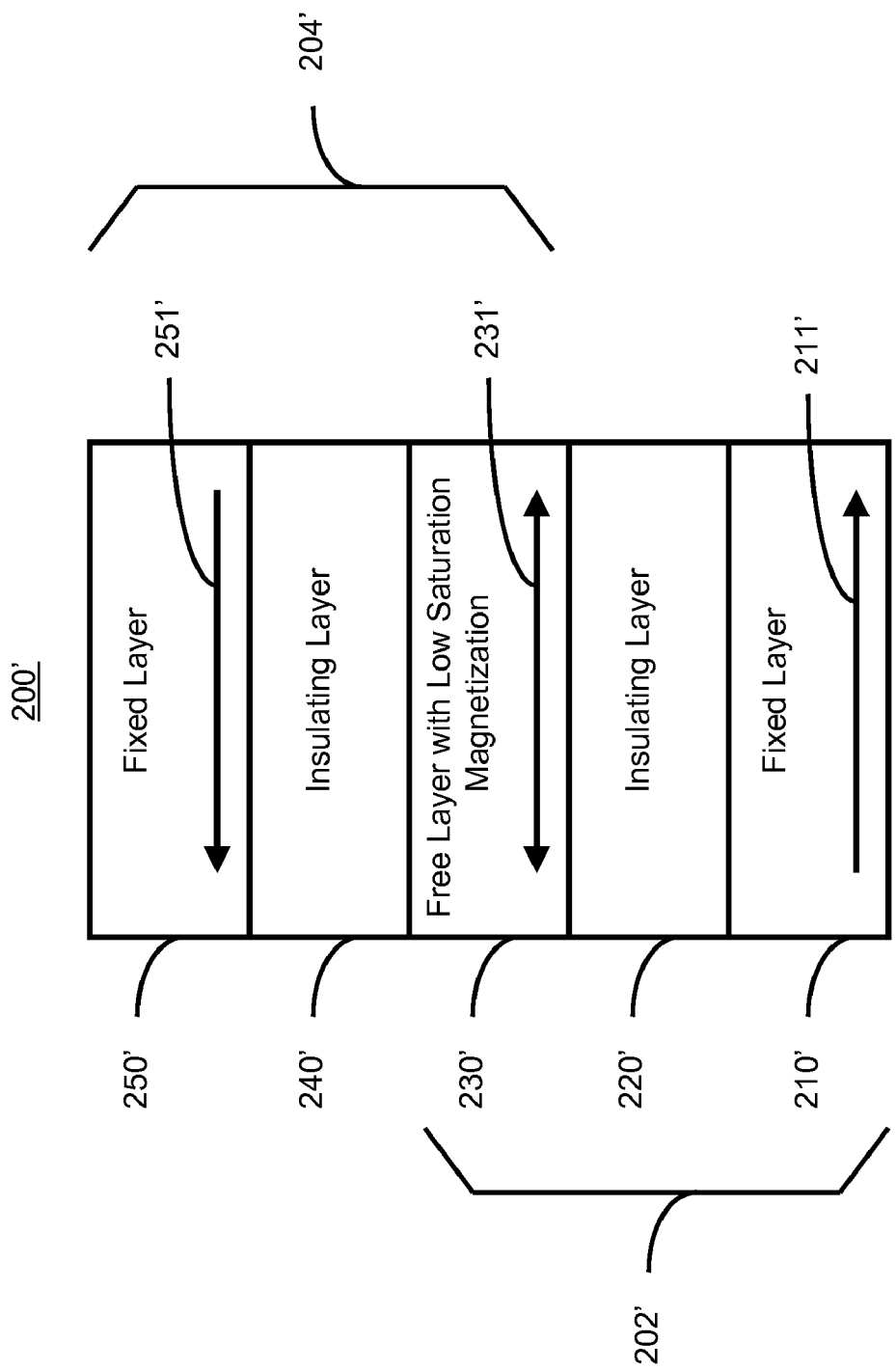
FIG. 3B depicts another implementation, a magnetic element having a low saturation magnetization free layer.

Further, the spacer layer 220 and spacer layer 240 of the magnetic element 200 can be both insulating or both conducting. FIG. 3B depicts a magnetic element 200' that is analogous to the magnetic element 200. Like the magnetic element 200, the magnetic element 200' includes a fixed layer 210' with a fixed layer magnetization 211', a free layer 230' having a low saturation magnetization 231' that can be switched due to spin transfer, and a fixed layer 250' with a fixed layer magnetization 251'. The magnetic element 200' also includes an insulating layer 220' that is analogous to the spacer layer 220 and an insulating layer 240' that is analogous to the spacer layer 240.

The free layer 230' can be configured in a manner analogous to the free layers 130, 130', 130'', 130''', 130'''', 130''''', and/or 130''''''. Thus, analogous materials and principles to those discussed above can be used to achieve the low saturation magnetization of the free layer 230'. For example, combining ferromagnetic with nonmagnetic materials can be used to achieve a low saturation magnetization for the free layer 230'. The magnetic element 200 can share the benefits of the magnetic elements 100, 100', 100'', 100''', 100'''', 100''''', and 100''''''', and their combinations. Furthermore, when the fixed layers 210' and 250' are aligned antiparallel, both the spin valve portion 204 and the magnetic tunneling junction portion 202 can contribute to writing the free layer 230.

FIG. 4 depicts another implementation of a portion of a magnetic element 300 having a low saturation magnetization free layer. The magnetic element includes a structure 302 and a structure 304, each of which is analogous to the magnetic element 100, 100', 100'', 100''', 100'''', 100''''', or 100''''''. Thus, the structure 302 includes a fixed layer 310, a spacer layer 320, and a free layer 330 that are analogous to, for example, the layers 110, 120, and 130, respectively, of the magnetic element 100. The structure 302 also includes a pinning layer 306 that can be an AFM layer. Similarly, the structure 304 includes a fixed layer 370, a spacer layer 360, and a free layer 350 that are analogous to, for example, the layers 110, 120, and 130, respectively, of the magnetic element 100. The structure 304 also includes pinning layer 380 that can be an AFM layer. One or both of the free layers 330 and 350 have a low saturation magnetization. Furthermore, the free layers 330 and 350 of the magnetic element 300 are magnetostatically coupled. The magnetostatic coupling can be configured so that the layers 330 and 350 are antiferromagnetically aligned. In the implementation shown, the magnetic element 300 includes a separation layer 340. The separation layer 340 is configured to ensure that the free layers 330 and 350 are only magnetostatically coupled. For example, the thickness of the separation layer 340, which can be a nonmagnetic conductor, can be configured to ensure that the free layers 330 and 350 are antiferromagnetically aligned due to a magnetostatic interaction. The separation layer 340 can serve to randomize the polarization of the spins passing through it. For example, the separation layer 340 includes materials such as Cu, Ag, Au, Pt, Mn, CuPt, CuMn, a Cu/Pt/Cu sandwich, a Cu/Mn/Cu sandwich, or a Cu/PtMn[1-20A]/Cu sandwich.

The free layer 330 and/or the free layer 350 are configured to have a low saturation magnetization, as defined above. Thus, the free layer 330 and/or 350 can correspond to the free layers 130, 130', 130'', 130''', 130'''', 130''''', or 130''''''. The materials and/or properties used in the free layer 330 and/or the free layer 350 can be the same as or analogous to those described above with respect to the magnetic elements 100, 100', 100'', 100''', 100'''', 100''''', or 100''''''. Thus, the magnetic element 300 can share many of the benefits of the magnetic elements 100, 100', 100'', 100''', 100'''', 100''''', or 100''''''. In particular, the magnetic element can be written using spin transfer at a lower switching current density.

The magnetostatic coupling between the free layers 330 and 350 can be implemented to provide further benefits. Because the free layers 350 and 330 are magnetostatically coupled, a change in magnetization of the free layer 350 can be reflected in the free layer 330. The spacer layer 320 can be replaced with a barrier layer to provide a high signal. Furthermore, because they have separate free layers 350 and 330 the properties of the spin valve 304 and the magnetic tunneling junction 302, respectively, can be separately controlled to improve their functions of the spin valve and spin tunneling junction, respectively.

Figure 5:
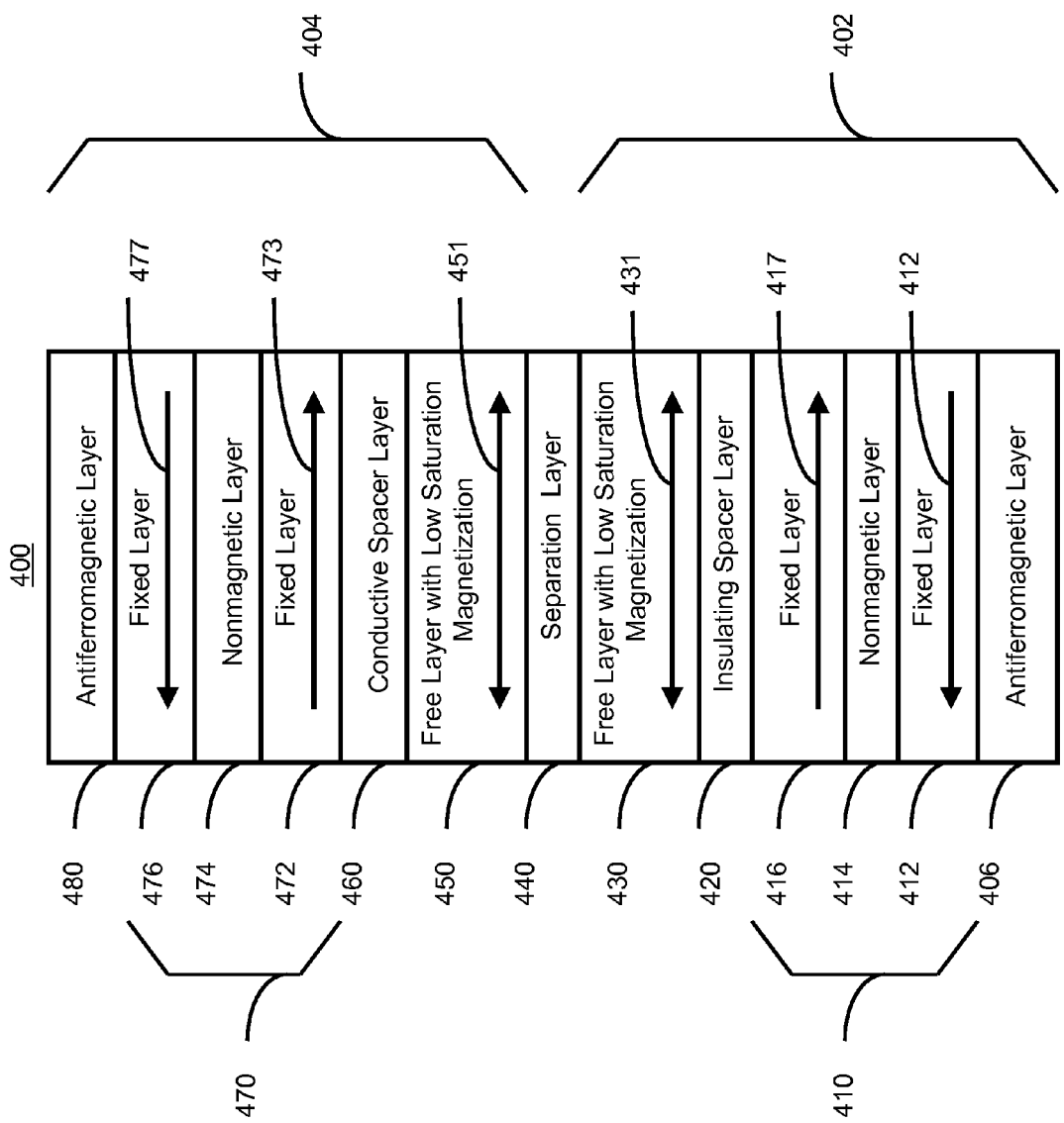
FIG. 5 depicts another implementation, a magnetic element having a low saturation magnetization free layer.

FIG. 5 depicts another implementation of a magnetic element 400 having a reduced low saturation magnetization free layer. The magnetic element 400 is analogous to the magnetic element 300 depicted in FIG. 4. Thus, analogous components are labeled similarly. Therefore, the magnetic element includes a free layer 430 and a free layer 450, which corresponds to the free layers 330 and 350, respectively, either or both of which has low saturation magnetization, and both of which are written using spin transfer. Moreover, the magnetic element 400 can utilize two terminals (not shown) near the top and bottom of the magnetic element. However, the magnetic element can use another number of terminals, for example a third terminal near the center of the magnetic element 400.

The magnetic element 400 includes a synthetic fixed layer 410 and a synthetic fixed layer 470. The fixed layer 410 includes a ferromagnetic layers 412 416 separated by a nonmagnetic layer 414 that can be Ru. The magnetizations of the ferromagnetic layers 412 and 416 are also aligned antiparallel. Similarly, the fixed layer 470 includes ferromagnetic layers 472 and 476 separated by a nonmagnetic layer 474 that can be Ru. The magnetizations of the ferromagnetic layers 472 and 476 are also aligned antiparallel. Furthermore, a spacer layer 420 can be a barrier layer that is insulating yet allows electrons to tunnel between the ferromagnetic layer 416 and the a free layer 430. The spacer layer 460 can be a conductive layer. Thus, the structure 402 is a spin tunneling junction, while the structure 404 is a spin valve.

The free layers 430 and/or 450 can be configured in a manner analogous to the free layers 130, 130', 130'', 130''', 130'''', 130''''', 130'''''' or the free layers 330 and 350, respectively. Thus, analogous materials and principles to those discussed above can be used to achieve the low saturation magnetization of the free layers 430 and/or 450. For example, combination of ferromagnetic materials with nonmagnetic materials can be used to achieve a low saturation magnetization for the free layer 430 and/or 450. Because of the low saturation magnetization, the magnetic element 500 can be written using spin transfer at a lower switching current density. The magnetic element 500 can share the benefits of the magnetic elements 100, 100', 100'', 100''', 100'''', 100''''', and 100'''''' and their combinations.

Furthermore, because the free layers 430 and 450 are magnetostatically coupled, a change in magnetization direction of the free layer 450, for example due to spin transfer induced writing, can be reflected in the magnetization of the free layer 430. With the barrier layer 420, the magnetic tunneling junction 402 can provide a high signal. In another implementation, the barrier layer 420 can be replaced by a conducting layer. However, in such an implementation, the read signal can decrease for a given read current.

In one implementation the magnetic element 400 can be configured such that the magnetizations of the ferromagnetic layer 412 and the ferromagnetic layer 476 are parallel. Because the ferromagnetic layers 412 and 476 have their magnetizations aligned parallel, the AFM layers 406 and 480 can be aligned in the same direction. The AFM layers 406 and 480 can, therefore, be aligned in the same step. Thus, processing is further simplified.

Some of the implementations of the magnetic elements 100, 100', 100'', 100''', 100'''', 100''''', 100'''''', 200, 300 and 400 can achieve the benefits of low spin transfer switching current, low magnetostriction, amorphous growth, and perpendicular anisotropy.

Figure 6:
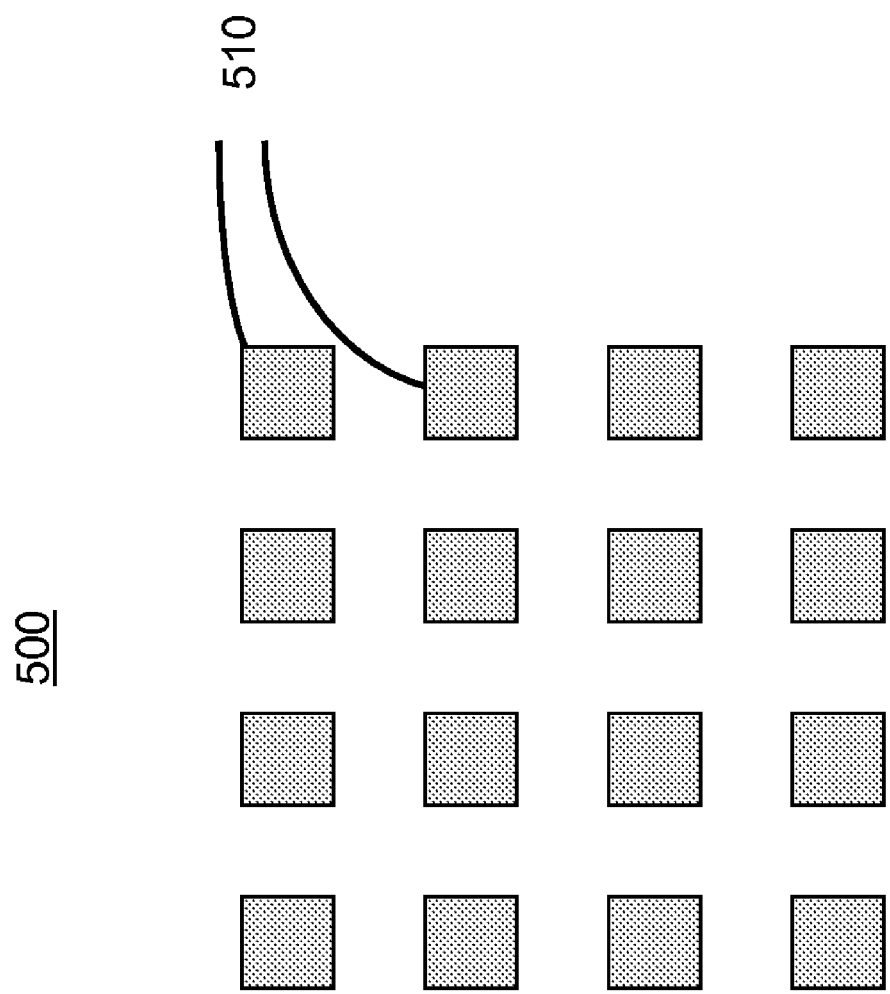
FIG. 6 depicts another implementation, a device having a low saturation magnetization free layer.

FIG. 6 depicts another implementation, a device 500 having an array of magnetic elements having at least one low magnetization free layer and having a low saturation magnetization free layer. The device 500 includes a an array of magnetic elements 510. Each magnetic element 510 includes at least a fixed layer, a spacer layer, and a free layer having a low saturation magnetization as described above. Magnetic elements 510 can include the principles seen in magnetic elements 100, 100', 100'', 100''', 100'''', 100''''', 100'''''', 200, 300, 400, or a combination of those elements. The device 500 can have isolation transistors (not shown), read and write lines (not shown), and logic circuitry (not shown) for accessing individual magnetic elements. The device 500 can be used in magnetic memory systems.

Figure 7:
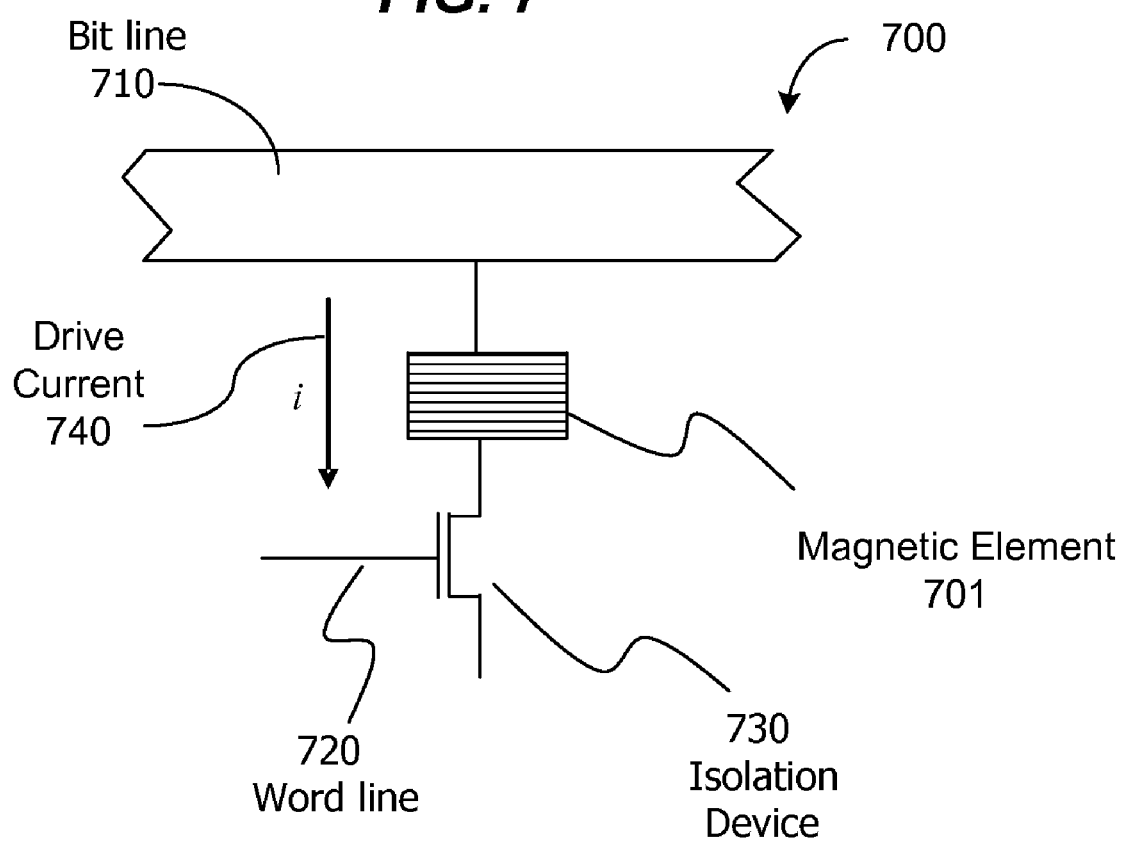
FIG. 7 depicts one implementation, a magnetic element having a low saturation magnetization free layer connected to a bit line and an isolation device.

FIG. 7 depicts another implementation, a device 700 having a magnetic element 701 based on the spin-transfer torque effect having at least one low magnetization free layer. A conductor line 710 labeled as "bit line" is electrically coupled to the magnetic element 701 by connecting to one end of the magnetic element 701 to supply an electrical drive current 740 through the layers of the magnetic element 701 to effectuate the spin-transfer torque effect in the magnetic element 701. An electronic isolation device 730, such as an isolation transistor, is connected to one side of the magnetic element 701 to control the current 740 in response to a control signal applied to the gate of the transistor 730. A second conductor line 720 labeled as "word line" is electrically connected to the gate of the transistor 730 to supply that control signal. In operation, the drive current 740 flows across the layers in the magnetic element 701 to change magnetization direction of the free layer when the current 740 is greater than a switching threshold which is determined by materials and layer structures of the magnetic element 701. The switching of the free layer in the magnetic element 701 is based on the spin-transfer torque caused by the drive current 740 alone without relying on a magnetic field produced by the lines 710 and 720 or other sources.

Figure 8:
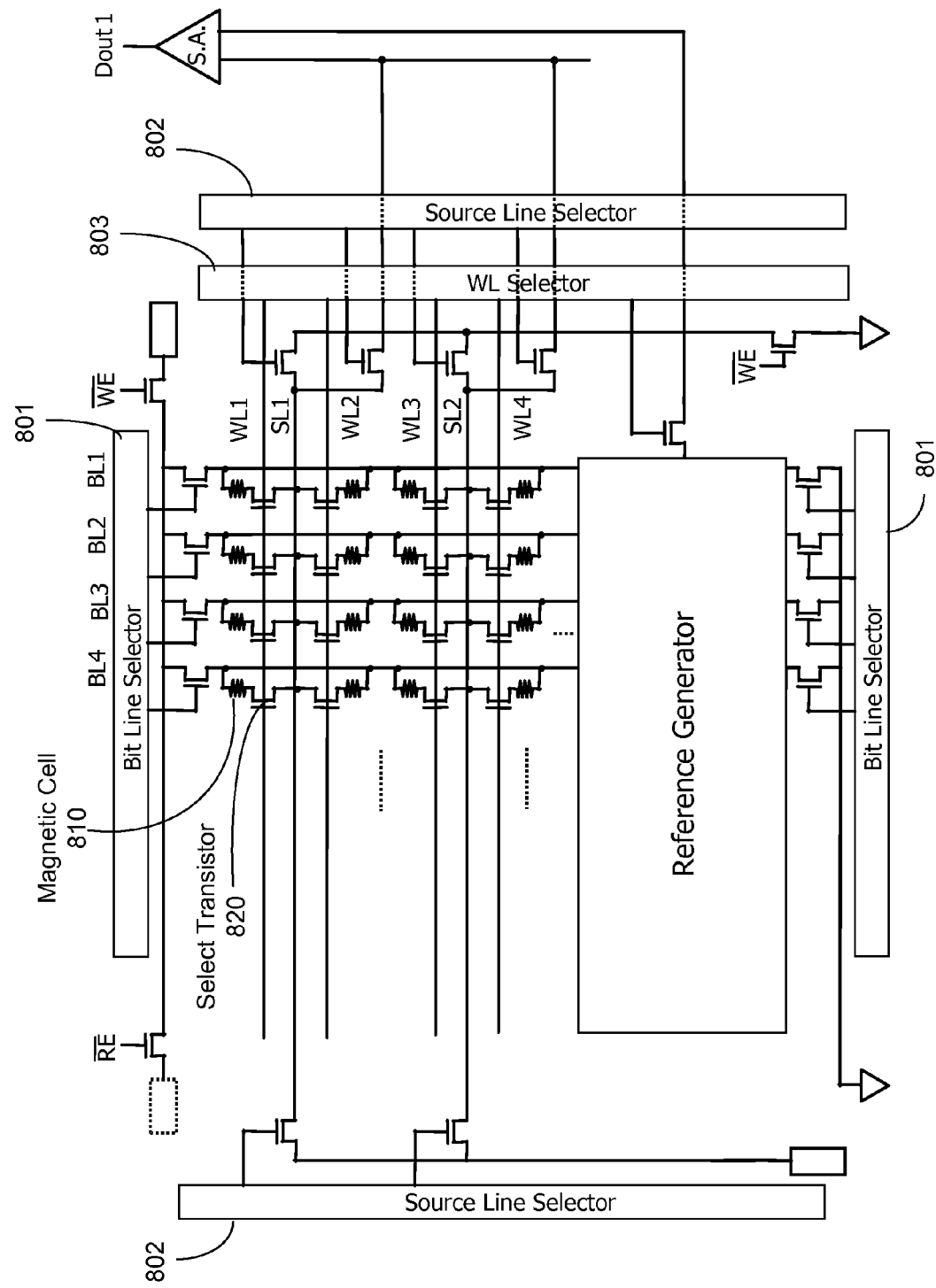
FIG. 8 depicts one implementation of the device in FIG. 7 illustrating a circuit that operates the device based on spin-transfer torque switching with low saturation magnetization.

In various applications, the magnetic cell shown in FIG. 7 is implemented as a unit cell of a magnetic array. FIG. 8 shows a bird view of an example of such an array formed on a substrate as an integrated circuit chip. FIG. 8 shows one implementation of the device in FIG. 7 illustrating a circuit that operates the device based on spin-transfer torque switching. Each magnetic cell contains at least one low magnetization free layer and is operated based on the spin-transfer torque switching. The cells 810 can be arranged and connected in an array in a common way without special requirement for the bit/source lines. Each cell 810 is connected in series to a select transistor 820 which corresponds to the isolation device 730 in FIG. 2. As illustrated, a bit line selector 801, a source line selector 802 and a word line selector 803 are coupled to the cell array to control the operations of each cell.

Magnetic elements have been described that include a low saturation magnetization free layer and can be written using spin. While the specification of this application contains many specifics, these should not be construed as limitations on the scope of any invention or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Only a few examples are described. One of ordinary skill in the art can readily recognize that variations, modifications and enhancements to the described examples may be made.

What is claimed is:

1. A device comprising:
   a magnetic element including:
   a first fixed layer having a fixed layer magnetization;
   a first free layer having a free layer magnetization that is changeable due to spin transfer when a write current above a threshold is passed through the first free layer, the first free layer including at least one ferromagnetic material and at least one nonmagnetic material, wherein the nonmagnetic material includes at least one of Zr, W, Ti, V or Hf;
   a first spacer layer that is nonmagnetic, the first spacer layer residing between the first fixed layer and the first free layer; and
   a high spin polarization layer residing between the first free layer and the first spacer layer wherein the high spin polarization layer has a higher spin polarization than the first free layer.

2. The device of claim 1 wherein the first free layer ferromagnetic material includes at least one of Co, Ni, or Fe.

3. The device of claim 1 wherein the first free layer ferromagnetic material includes at least one of alloy of CoNi, CoFe, NiFe, or CoNiFe.

4. The device of claim 1 wherein the first free layer includes at least five atomic percent and less than or equal to fifty atomic percent Zr, W, Ti, V, or Hf.

5. The device of claim 1 wherein the first spacer layer includes an insulating material.

6. The device of claim 5 wherein the insulating material includes $Al_2O_3$ or MgO.

7. The device of claim 1 wherein the first spacer layer includes a conducting layer.

8. The device of claim 7 wherein the conducting layer includes at least one of Ru, Re, Cu, Ta or Cu, and an alloy that includes Ru, Re, Cu, Ta or Cu.

9. The device of claim 1 wherein the first fixed layer includes at least one ferromagnetic material and at least one nonmagnetic material;
   wherein the nonmagnetic material includes at least one of Zr, W, Ti, V, or Hf.

10. The device of claim 1 wherein the first fixed layer is a first synthetic fixed layer.

11. The device of claim 1 wherein the first free layer is a first synthetic free layer.

12. The device of claim 1 comprising:
    a plurality of magnetic elements.

13. The device of claim 1 comprising:
    a conductor line;
    a plurality of magnetic cells, each magnetic cell electrically connected to the conductor line to receive an electric current, each magnetic cell comprising a magnetic element; and
    a circuit comprising a plurality isolation transistors, each isolation transistor electrically connected to a magnetic element inside a respective magnetic cell to control the electric current through the magnetic element.

14. A device comprising:
    a magnetic element including:
    a first fixed layer having a fixed layer magnetization;
    a first spacer layer that is nonmagnetic;
    a first free layer having a free layer magnetization that is changeable due to spin transfer when a write current above a threshold is passed through the free layer;
    the first spacer layer residing between the first fixed layer and the first free layer, the first free layer including at least one ferromagnetic material and at least two nonmagnetic materials X and Y;

wherein the nonmagnetic material X includes at least one of Ti, Zr, or Hf; and wherein the nonmagnetic material Y includes at least one of V, Nb, Ta, Cr, Mo, W, or Re.

15. The device of claim 14 wherein the first free layer ferromagnetic material includes at least one of Co, Ni, or Fe.

16. The device of claim 14 wherein the first free layer ferromagnetic material includes at least one of alloy of CoNi, CoFe, NiFe, or CoNiFe.

17. The device of claim 14 wherein the first free layer includes materials X and Y whose combined contents range from at least five atomic percent to less than or equal to fifty atomic percent.

18. The device of claim 17 wherein a ratio of the atomic percentages of the materials X and Y are controlled to achieve low magnetostriction.

19. The device of claim 14 wherein materials X and Y include Zr and Ta;

wherein the combined contents of Zr and Ta range from at least five atomic percent to less than or equal to fifty atomic percent;

wherein the atomic percentage of Zr is greater than the atomic percentage of Ta;

wherein the first free layer is in the hcp or fcc structure; and wherein the first free layer has a perpendicular anisotropy.

20. The device of claim 14 wherein materials X and Y include Zr and Ta;

wherein the combined contents of Zr and Ta range from at least five atomic percent to less than or equal to fifty atomic percent;

wherein the atomic percentage of Zr is less than the atomic percentage of Ta; and wherein the first free layer is in the bcc structure.

21. The device of claim 14 wherein the first spacer layer includes an insulating material.

22. The device of claim 21 wherein the insulating material includes $Al_2O_3$ or MgO.

23. The device of claim 14 wherein the first spacer layer includes a conducting layer.

24. The device of claim 23 wherein the conducting layer includes at least one of Ru, Re, Cu, Ta and Cu, or an alloy that includes Ru, Re, Cu, Ta or Cu.

25. The device of claim 14 comprising:

a high spin polarization layer residing between the first free layer and the first spacer layer wherein the high spin polarization layer has a higher spin polarization than the first free layer.

26. The device of claim 14 wherein the first fixed layer includes at least one ferromagnetic material and at least two nonmagnetic materials X and Y; and wherein the nonmagnetic material X includes at least one of Ti, Zr, or Hf and the nonmagnetic material Y includes at least one of V, Nb, Ta, Cr, Mo, W, or Re.

27. The device of claim 14 wherein the first fixed layer is a first synthetic fixed layer.

28. The device of claim 14 wherein the first free layer is a first synthetic free layer.

29. The device of claim 14 comprising:

a second spacer layer that is nonmagnetic; the first free layer residing between the second spacer layer and the first spacer layer and a second fixed layer; the second spacer layer residing between the second fixed layer and the first free layer.

30. The device of claim 29 wherein the first spacer layer includes an insulating material and the second spacer layer includes an insulating material.

31. The device of claim 29 wherein the first spacer layer includes a conducting material and the second spacer layer includes an insulating material.

32. The device of claim 14 comprising:

a first separation layer; the first free layer residing between the first spacer layer and the first separation layer;

a second free layer having a free layer magnetization that is changeable due to the magnetic field created by the first free layer; the first separation layer residing between the first free layer and the second free layer;

a second spacer layer that is nonmagnetic; the second free layer residing between the second spacer layer and the first separation layer; and a second fixed layer having a fixed layer magnetization; the second spacer layer residing between the second fixed layer and the second free layer.

33. The device of claim 14 comprising:

a plurality of magnetic elements.

34. The device of claim 14 comprising:

a conductor line;

a plurality of magnetic cells, each magnetic cell electrically connected to the conductor line to receive an electric current, each magnetic cell comprising a magnetic element; and a circuit comprising a plurality isolation transistors, each isolation transistor electrically connected to a magnetic element inside a respective magnetic cell to control the electric current through the magnetic element.

* * * * *